(12) United States Patent
Hirano

(10) Patent No.: US 10,049,870 B2
(45) Date of Patent: Aug. 14, 2018

(54) METHOD OF MANUFACTURING SEMICONDUCTOR DEVICE INCLUDING SILICON NITRIDE LAYER FOR INHIBITING EXCESSIVE OXIDATION OF POLYSILICON FILM

(71) Applicant: Hitachi Kokusai Electric Inc., Tokyo (JP)

(72) Inventor: Akito Hirano, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 140 days.

(21) Appl. No.: 15/042,648

(22) Filed: Feb. 12, 2016

(65) Prior Publication Data

US 2016/0172191 A1    Jun. 16, 2016

Related U.S. Application Data

(63) Continuation of application No. 13/627,085, filed on Sep. 26, 2012, now abandoned.

(30) Foreign Application Priority Data

Sep. 27, 2011   (JP) .................................. 2011-210427
Aug. 28, 2012   (JP) .................................. 2012-187883

(51) Int. Cl.
*C23C 16/34*       (2006.01)
*H01L 21/02*       (2006.01)
(Continued)

(52) U.S. Cl.
CPC .. *H01L 21/02332* (2013.01); *H01J 37/32082* (2013.01); *H01J 37/32669* (2013.01);
(Continued)

(58) Field of Classification Search
CPC .......... C23C 16/34; C23C 16/40; H01L 21/02
See application file for complete search history.

(56) References Cited

U.S. PATENT DOCUMENTS 5,616,947 A * 4/1997 Tamura ............. H01L 21/28264
                                                             257/289
5,720,642 A * 2/1998 Hattori .................... H01J 9/025
                                                             445/24
(Continued)

FOREIGN PATENT DOCUMENTS

JP        06244364        9/1994
JP        H08-051105      2/1996
(Continued)

OTHER PUBLICATIONS

Liao, Yi-Ying, et al., "The Effects of Program/Erase Cycles on the ONO Stack Layer in SONOS Flash Memory Cell Investigated by a Variable-Amplitude Low-Frequency Charge-Pumping Technique". IEEE Transactions on Device and Materials Reliability, vol. 9, No. 2, Sep. 2009, pp. 356-360.*

(Continued)

*Primary Examiner* — Bret P Chen
(74) *Attorney, Agent, or Firm* — Edell, Shapiro & Finnan, LLC

(57) ABSTRACT

To inhibit excessive oxidation and increase oxidation resistance of a polysilicon film on a substrate during recovery process, an oxygen-containing silicon layer present on the substrate is modified into a silicon oxynitride layer or a silicon nitride layer with high nitrogen concentration prior to the recovery process by heating the substrate and supplying active species containing nitrogen radicals and hydrogen radicals for increasing nitrogen content in the silicon oxynitride layer or the silicon nitride layer.

9 Claims, 10 Drawing Sheets

(51) Int. Cl.
*H01J 37/32* (2006.01)
*H01L 21/321* (2006.01)
*H01L 21/67* (2006.01)
*H01L 21/28* (2006.01)
*H01L 27/11517* (2017.01)

(52) U.S. Cl.
CPC .. *H01L 21/02068* (2013.01); *H01L 21/02247* (2013.01); *H01L 21/3211* (2013.01); *H01L 21/67109* (2013.01); *H01L 21/67115* (2013.01); *H01L 21/28273* (2013.01); *H01L 27/11517* (2013.01)

(56) References Cited

U.S. PATENT DOCUMENTS

| | | | |
|---|---|---|---|
| 6,228,732 B1 | 5/2001 | Richardson et al. | |
| 6,727,654 B2 | 4/2004 | Ogawa et al. | |
| 7,291,568 B2 | 11/2007 | Burnham et al. | |
| 2002/0042193 A1* | 4/2002 | Noguchi | H01L 21/02074 438/618 |
| 2002/0068420 A1* | 6/2002 | Goodwin | H01L 21/32055 438/459 |
| 2004/0171241 A1 | 9/2004 | Kitamura et al. | |
| 2004/0244823 A1* | 12/2004 | Kim | C11D 3/042 134/28 |
| 2004/0262702 A1* | 12/2004 | Herner | H01L 21/28088 257/411 |
| 2009/0179253 A1* | 7/2009 | Levy | C23C 16/0272 257/324 |
| 2009/0280615 A1* | 11/2009 | Lee | H01L 21/28061 438/306 |
| 2010/0227478 A1 | 9/2010 | Harada | |
| 2010/0317199 A1* | 12/2010 | Horie | C23C 16/34 438/758 |
| 2011/0256708 A1* | 10/2011 | Choi | H01L 21/3105 438/593 |
| 2011/0308453 A1 | 12/2011 | Su et al. | |
| 2012/0071002 A1 | 3/2012 | Nakayama | |
| 2016/0141180 A1* | 5/2016 | Jenne | G11C 16/04 257/324 |

FOREIGN PATENT DOCUMENTS

| | | |
|---|---|---|
| JP | 2004221459 | 8/2004 |
| JP | 2007005696 | 1/2007 |
| JP | 20100171350 | 8/2010 |
| JP | 2011023730 | 2/2011 |
| KR | 10-0641762 | 11/2006 |

OTHER PUBLICATIONS

Li, C.X., et al., "A feasibility study of plasma nitriding of steel with an oxide layer on the surface". J. Mater. Sci, (2006) 41:6116-6118.*
Yee, Youngjoo, et al., "Polysilicon surface modification technique to reduce sticking of microstructures". Transducers '95, Eurosensors IX, The 8th International Conference on Solid-State Sensors and Acutators, and Eurosensors IX, Jun. 25-29, 1995, pp. 206-209.*
Office Action in corresponding Korean Application No. 10-2012-0106174, dated Oct. 30, 2013, along with English translation.

* cited by examiner

METHOD OF MANUFACTURING SEMICONDUCTOR DEVICE INCLUDING SILICON NITRIDE LAYER FOR INHIBITING EXCESSIVE OXIDATION OF POLYSILICON FILM

CROSS REFERENCE TO RELATED APPLICATIONS

This application is a continuation of U.S. patent application Ser. No. 13/627,085 filed Sep. 26, 2012, now abandoned, which claims foreign priority under 35 U.S.C. § 119(a)-(d) to Application Nos. JP 2011-210427 and 2012-187883 filed on Sep. 27, 2011 and Aug. 28, 2012, respectively, the entire contents of each of which are hereby incorporated by reference.

FIELD OF THE INVENTION

The present invention relates to a substrate processing apparatus for processing a substrate using an excited process gas, a method of manufacturing a semiconductor device and a non-transitory computer-readable recording medium.

BACKGROUND

One process for manufacturing a semiconductor device such as a flash memory may include a substrate processing process such as a process for loading a substrate, which includes a gate electrode whose sidewall is exposed by etching, into a process chamber; and a process for performing oxidation by supplying a hydrogen-containing gas and an oxygen-containing gas, which are excited with plasma for the substrate, into a process chamber. In such a substrate processing process, the etching damage, which is caused as the etching is performed on the sidewall of the gate electrode formed of a polysilicon film, is recovered by performing the oxidation. However, for example, when the sidewall of the polysilicon film is recovered, the polysilicon film may be oxidized to an excessive extent exceeding a desired level.

Therefore, to inhibit excessive oxidation of the polysilicon film, for example, a substrate processing process for forming a nitride layer on a polysilicon film in advance may be performed by supplying a process gas including nitrogen atoms excited with plasma into a process chamber and supplying a process gas into a substrate before oxidation.

For example, although a nitride layer is formed to achieve the above-described objects, an oxygen-containing layer such as a native oxide layer may be formed on a substrate by exposing the substrate to the atmosphere through transfer of the substrate before formation of the nitride layer. When the nitride layer is formed on the substrate on which such an oxygen-containing layer such as a native oxide layer is formed by supplying a process gas containing nitrogen atoms, it is impossible to increase a concentration of the nitrogen atoms in the nitride layer. Therefore, when etching damage of sidewalls of a polysilicon film caused by oxidation is recovered, there have been cases in which excessive oxidation of the polysilicon film may not be inhibited.

SUMMARY

The objects of the present invention aim at providing a substrate processing apparatus including a polysilicon film having improved oxidation resistance by modifying an oxygen-containing layer into an oxynitride layer or a nitride layer having a high nitrogen concentration, and a method and program for manufacturing a semiconductor device.

According to one embodiment, there is provided a substrate processing apparatus including: a process chamber accommodating a substrate including a polysilicon film having an oxygen-containing layer formed thereon; a heating unit installed in the process chamber to heat the substrate; a gas supply unit configured to supply a process gas containing nitrogen and hydrogen to the substrate in the process chamber; an excitation unit configured to excite the process gas supplied into the process chamber; an exhaust unit configured to exhaust an inside of the process chamber; and a control unit configured to control at least the heating unit, the gas supply unit, the excitation unit and the exhaust unit so as to modify the oxygen-containing layer into an oxynitride layer or a nitride layer by heating the substrate to a predetermined temperature using the heating unit, exciting the process gas supplied by the gas supply unit using the excitation unit, and supplying the process gas excited by the excitation unit to the substrate.

According to another embodiment, there is provided a method of manufacturing a semiconductor device including: loading a substrate into a process chamber, the substrate including a polysilicon film having an oxygen-containing layer formed thereon; heating the substrate; supplying a process gas containing nitrogen and hydrogen into the process chamber; and modifying the oxygen-containing layer into an oxynitride layer or a nitride layer by exciting the process gas supplied into the process chamber and supplying an excited process gas to a surface of the substrate.

According to still another embodiment, there is provided a non-transitory computer-readable recording medium storing a program that causes a computer to perform a process, the process including: heating a substrate accommodated in a process chamber, the substrate including a polysilicon film having an oxygen-containing layer thereon; supplying a process gas containing nitrogen and hydrogen into the process chamber; and modifying the oxygen-containing layer into an oxynitride layer or a nitride layer by exciting the process gas supplied into the process chamber and supplying an excited process gas to a surface of the substrate.

DETAILED DESCRIPTION

Findings Obtained by the Present Inventors

First, the findings obtained by the present inventors will be described prior to description of embodiments of the present invention.

The recovery by the above-described etching and oxidation is, for example, performed on a gate structure of a flash memory, etc. In general, the flash memory is formed, for example, by sequentially stacking a silicon oxide film ($SiO_2$ film), a polysilicon film, a thin film having an ONO structure and a polysilicon film on a wafer 200 such as a silicon substrate and patterning each film through dry etching as described above using a predetermined resist pattern as a mask. Each film functions as a tunnel gate-insulating film, a floating gate, an interelectrode insulating film, and a control gate.

When the stacked film is patterned, for example, etching damage to the sidewalls of the polysilicon film may often be caused. Therefore, the oxidation is carried out to recover the etching damage as described above. In this case, however, bird beaks as will be described below may be formed. That is, an oxide species used for the oxidation penetrates into the stacked film from an end of the stacked film, and the polysilicon film may be oxidized by reaction with the oxide species in the vicinity of the interface between the polysilicon film and an oxide film in the ONO structure, thereby forming the bird beaks. When the bird beaks are formed, the reliability of a semiconductor device may be lowered due to a decrease in capacitance of the gate structure.

However, when a nitride layer is formed in advance between the polysilicon film and the oxide film in the ONO structure, diffusion of oxidation toward the polysilicon film during the oxidation is difficult, thereby inhibiting formation of the bird beaks.

As described above, however, when a substrate is transferred to the atmosphere prior to performing the nitridation on the polysilicon film, a native oxide layer may be formed on the polysilicon film. Even when the nitridation is performed, for example, by supplying nitrogen gas ($N_2$ gas) to such a polysilicon film having an oxygen-containing layer formed thereon, such as a native oxide layer, a nitride layer having a sufficiently high concentration of nitrogen atoms may not be formed.

Accordingly, the present inventors have obtained the findings of a method capable of solving the above-described problems since a surface of the polysilicon film may be nitride, and the oxygen-containing layer may be modified into an oxynitride layer or a nitride layer having a high nitrogen concentration as well when the nitridation is performed on the polysilicon film. Therefore, the present invention was based on the findings obtained by the present inventors.

One Embodiment of the Present Invention

One embodiment of the present invention will be described with reference to the drawings.

(1) Configuration of Substrate Processing Apparatus

Figure 1:
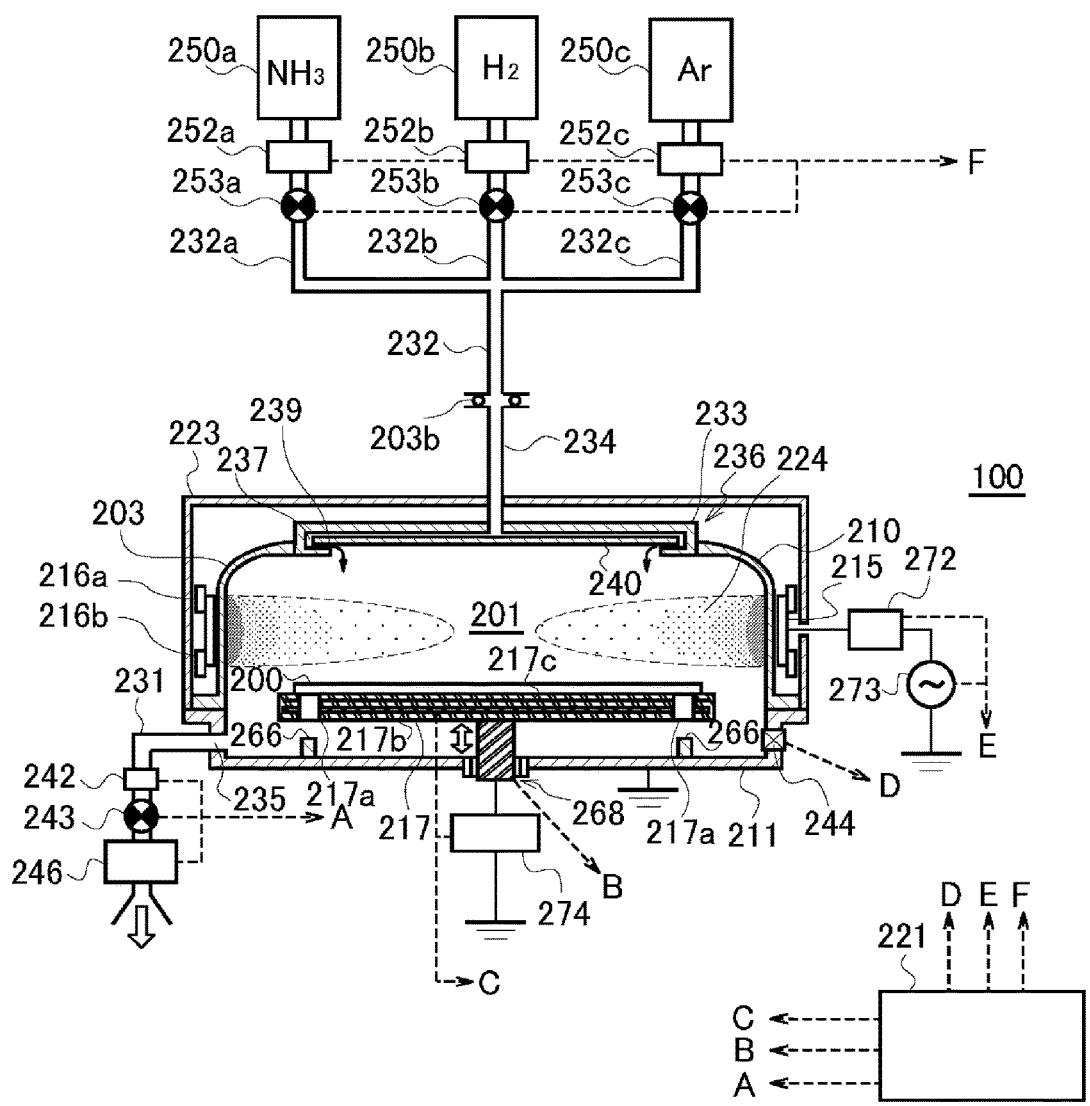
FIG. 1 is a schematic cross-sectional view of a substrate processing apparatus according to one embodiment of the present invention.

First, the substrate processing apparatus according to this embodiment will be described with reference to FIG. 1. FIG. 1 is a schematic cross-sectional view of a substrate processing apparatus configured as an MMT apparatus.

An MMT apparatus is an apparatus configured to plasma-process a wafer 200 serving as a substrate made of, for example, silicon using a modified magnetron typed plasma source which can generate high-density plasma by means of an electric field and a magnetic field. The MMT apparatus may perform various kinds of plasma processing, for example, by exciting a process gas into a plasma state to oxidize/nitride a surface of a substrate or a thin film formed on the substrate, form a thin film on the substrate, or etch a surface of the substrate.

(Process Chamber)

A processing container 203 constituting a process chamber 201 of the substrate processing apparatus 100 according to this embodiment includes a dome-shaped upper container 210 serving as a first container, and a bowl-shaped lower container 211 serving as a second container. The process chamber 201 is formed by covering the upper container 210 on the lower container 211. For example, the upper container 210 is formed of a non-metallic material such as aluminum oxide ($Al_2O_3$) or quartz ($SiO_2$), and the lower container 211 is, for example, formed of aluminum (Al).

A gate valve 244 serving as a sluice valve is installed at the sidewall of the lower container 211. When the gate valve 244 is open, a transfer mechanism (not shown) may be used to load the wafer 200 into the process chamber 201 or unload the wafer 200 from the process chamber 201. When the gate valve 244 is closed, an inside of the process chamber 201 is configured to be hermetically closed.

(Substrate Supporting Unit)

A susceptor 217 serving as a substrate supporting unit configured to support the wafer 200 is disposed at a lower center of the inside of the process chamber 201. The susceptor 217 may be, for example, formed of a non-metallic material such as aluminum nitride (AlN), ceramics or quartz so as to reduce metal contamination of the wafer 200. Also, the susceptor 217 is electrically insulated from the lower container 211.

An inside of the susceptor 217 is equipped with an impedance electrode 217c configured to change impedance. The impedance electrode 217c is installed via an impedance variation mechanism 274. The impedance variation mechanism 274 includes a coil or variable condenser, and is configured to control an electric potential of the wafer 200 via the impedance electrode 217c and the susceptor 217 by controlling a pattern number of the coil and a capacitance value of the variable condenser. Also, a controller 221 as will be described below is electrically connected to the impedance variation mechanism 274.

A susceptor lift mechanism 268 configured to lift the susceptor 217 is installed at the susceptor 217. A through hole 217a is installed in the susceptor 217. At least three wafer lift pins 266 configured to raise or lower the wafer 200 are installed at a bottom surface of the above-described lower container 211. When the susceptor 217 is lowered by the susceptor lift mechanism 268, the through hole 217a and the wafer lift pins 266 are disposed so that the wafer lift pins 266 can pass through the through hole 217a without coming in contact with the susceptor 217.

(Heating Unit)

A heater 217b serving as a heating unit is configured to heat the wafer 200 since the heater 217b is mounted integrally with an inside of the susceptor 217. When electric power is supplied to the heater 217b, a surface of the wafer 200 is configured to be heated to a predetermined temperature (for example, 350° C. to 700° C., preferably 450° C. to 700° C.). Also, a temperature sensor (not shown) is installed at the susceptor 217. A controller 221 as will be described below is electrically connected to the heater 217b and the temperature sensor. The controller 221 is configured to control electric power to be supplied to the heater 217b based on temperature information detected by the temperature sensor.

(Gas Supply Unit)

A shower head 236 configured to supply a process gas into the process chamber 201 is installed in an upper portion of the process chamber 201. The shower head 236 includes a cap-shaped cover 233, a gas introduction section 234, a buffer chamber 237, a shield plate 240 and a gas outlet 239.

The cover 233 is hermetically installed at an opening formed on an upper surface of the upper container 210. A shield plate 240 is installed below the cover 233. A space formed between the cover 233 and the shield plate 240 is a buffer chamber 237. The buffer chamber 237 functions as a dispersion space through which a process gas introduced through the gas introduction section 234 is dispersed. The process gas passing through the buffer chamber 237 is configured to be supplied into the process chamber 201 through the gas outlet 239 arranged at a lateral portion of the shield plate 240. Also, an opening is installed at the cover 233. A downstream end of the gas introduction section 234 is hermetically installed at the opening of the cover 233. A downstream end of the gas supply pipe 232 is connected to an upstream end of the gas introduction section 234 via an O-ring 203b serving as an encapsulation member.

A downstream end of a nitrogen-containing gas supply pipe 232a configured to supply a nitrogen-containing gas such as ammonia gas ($NH_3$ gas) serving as the process gas, a downstream end of a hydrogen-containing gas supply pipe 232b configured to supply a hydrogen-containing gas such as hydrogen gas ($H_2$ gas) serving as the process gas, and a downstream end of a rare gas supply pipe 232c configured to supply a rare gas, for example, Ar gas serving as an inert gas, are connected to an upstream side of the gas supply pipe 232 so that the downstream ends of the nitrogen-containing gas supply pipe 232a, the hydrogen-containing gas supply pipe 232b and the rare gas supply pipe 232c join together at the upstream side of the gas supply pipe 232. The gas supply pipe 232, the nitrogen-containing gas supply pipe 232a, the hydrogen-containing gas supply pipe 232b and the rare gas supply pipe 232c are, for example, formed of a non-metallic material such as quartz or aluminum oxide and a metallic material such as SUS.

An $NH_3$ gas supply source 250a, a mass flow controller 252a serving as a flow rate control device, and a valve 253a serving as an opening/closing valve are connected to the nitrogen-containing gas supply pipe 232a sequentially from an upstream side thereof. A $H_2$ gas supply source 250b, a mass flow controller 252b serving as a flow rate control device, and a valve 253b serving as an opening/closing valve are connected to the hydrogen-containing gas supply pipe 232b sequentially from an upstream side thereof. An Ar gas supply source 250c, a mass flow controller 252c serving as a flow rate control device, and a valve 253c serving as an opening/closing valve are connected to the rare gas supply pipe 232c sequentially from an upstream side thereof.

A controller 221 as will be described below is electrically connected to the mass flow controllers 252a to 252c and the valves 253a to 253c. The controller 221 is configured to control the mass flow controllers 252a to 252c and the opening/closing of the valves 253a to 253c so that a flow rate of a gas supplied into the process chamber 201 reaches a predetermined flow rate. The controller 221 is configured to allow $NH_3$ gas, $H_2$ gas and Ar gas to be freely supplied into the process chamber 201 via the gas supply pipe 232, the buffer chamber 237 and the gas outlet 239 while allowing the mass flow controllers 252a to 252c to control a flow rate through the opening/closing of the valves 253a to 253c.

In general, the gas supply unit according to this embodiment includes the shower head 236, the O-ring 203b, the gas supply pipe 232, the nitrogen-containing gas supply pipe 232a, the hydrogen-containing gas supply pipe 232b, the rare gas supply pipe 232c, the mass flow controllers 252a to 252c and the valves 253a to 253c. Also, the gas supply unit may further include the $NH_3$ gas supply source 250a, the $H_2$ gas supply source 250b, and the Ar gas supply source 250c.

(Exhaust Unit)

A gas exhaust port 235 configured to exhaust a process gas from an inside of the process chamber 201 is installed beneath a sidewall of the lower container 211. An upstream end of the gas exhaust pipe 231 configured to exhaust a gas is connected to the gas exhaust port 235. An APC 242 serving as a pressure regulator, a valve 243 serving as an opening/closing valve, and a vacuum pump 246 serving as an exhaust device are installed at the gas exhaust pipe 231 sequentially from an upstream side thereof. Also, a pressure sensor (not shown) is installed at the gas exhaust pipe 231. A controller 221 as will be described below is electrically connected to the APC 242, the valve 243, the vacuum pump 246 and the pressure sensor. As the vacuum pump 246 is driven to open the valve 243, an inside of the process chamber 201 may be exhausted. Also, as an opening degree of the APC 242 is adjusted based on the pressure information detected by the pressure sensor, a pressure value in the process chamber 201 may be adjusted. In general, the exhaust unit according to this embodiment includes the gas exhaust port 235, the gas exhaust pipe 231, the APC 242, and the valve 243. Also, the exhaust unit may further include the vacuum pump 246.

(Excitation Unit)

A tubular electrode 215 serving as a plasma-generating electrode is installed at an external circumference of the processing container 203 (upper container 210) to surround a plasma-generating region 224 in the process chamber 201. The tubular electrode 215 is formed in a tubular shape, for example, a cylindrical shape. The tubular electrode 215 is connected to a high-frequency power source 273 configured to generate high-frequency electric power via a matching transformer 272 configured to perform matching of impedance. The tubular electrode 215 functions as a discharge mechanism configured to excite a process gas supplied into the process chamber 201 and then supplied to a surface of the wafer 200.

An upper magnet 216a and a lower magnet 216b are installed at upper and lower ends of an external surface of the tubular electrode 215, respectively. Each of the upper magnet 216a and the lower magnet 216b is formed of a permanent magnet formed in a tubular shape, for example, a ring shape. The upper magnet 216a and the lower magnet 216b have magnetic poles at both ends of the process chamber 201 in a radial direction (that is, inner and outer circumferential ends of each magnet). The magnetic poles of the upper magnet 216a and the lower magnet 216b are disposed so that the magnetic poles can be formed in opposite directions. That is, the magnetic poles of inner circumferential portions of the upper magnet 216a and the lower magnet 216b become different poles. Therefore, a magnetic line of force in a cylindrical axis direction is formed along an inner lateral surface of the tubular electrode 215.

In a place in which a magnetic field is formed by the upper magnet 216a and the lower magnet 216b after the supply of the process gas into the process chamber 201 is initiated, a magnetron discharge plasma may be generated at a plasma-generating region 224 in the process chamber 201 by supplying a high-frequency electric power to the tubular electrode 215 to form an electric field. In this case, the above-described electric field and magnetic field may be allowed to rotate emitted electrons to increase an ionization generation rate of the plasma, thereby generating high-density plasma having a long life span.

In general, the excitation unit according to this embodiment includes the tubular electrode 215, the upper magnet 216a, and the lower magnet 216b. Also, the excitation unit may further include the matching transformer 272, and the high-frequency power source 273.

Also, a shield plate 223 made of a metal configured to effectively shield the electric field and the magnetic field is installed at surroundings of the tubular electrode 215, the upper magnet 216a and the lower magnet 216b so that the electric field and magnetic field formed by the tubular electrode 215, the upper magnet 216a and the lower magnet 216b cannot have an adverse effect on external environments or other devices such as a processing furnace.

(Control Unit)

Figure 10:
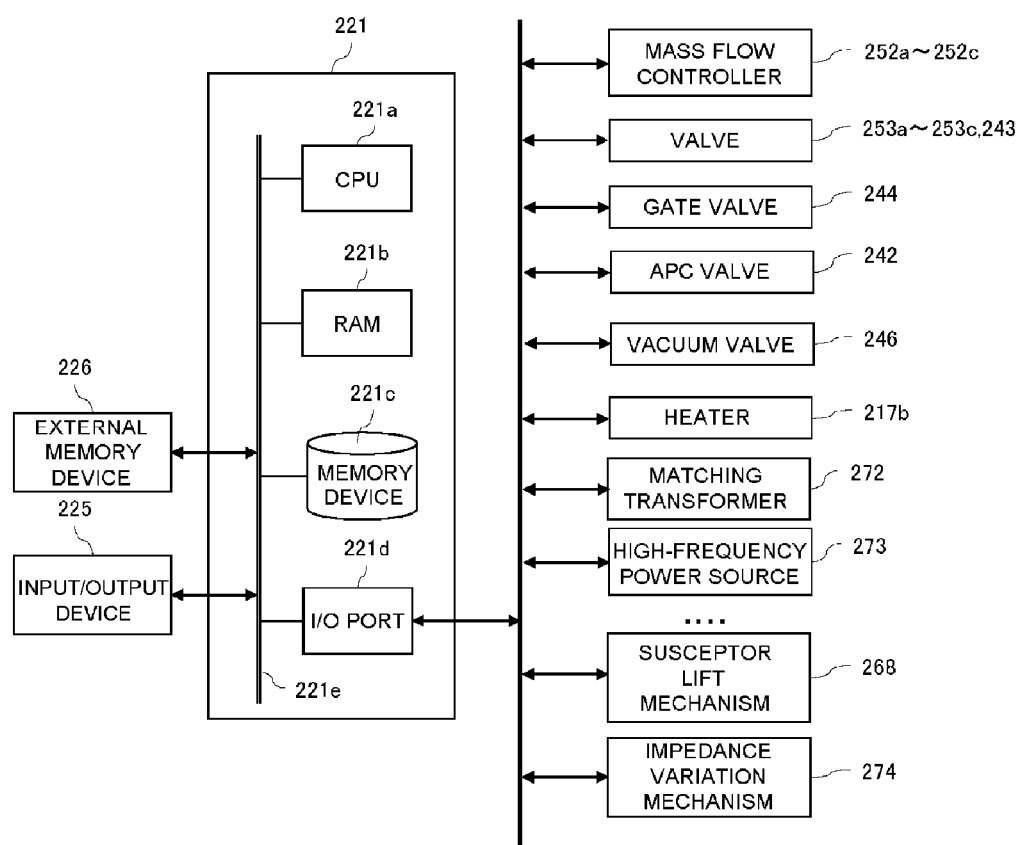
FIG. 10 is a schematic configuration diagram of a controller of the substrate processing apparatus which may be preferably used in the embodiments of the present invention.

As shown in FIG. 10, the controller 221 serving as a control unit is formed as a computer including a central processing unit (CPU) 221a, a random access memory (RAM) 221b, a memory device 221c, and an I/O port 221d. The RAM 221b, the memory device 221c, and the I/O port 221d are configured to be able to exchange data with the CPU 221a via an internal bus 221e. For example, a touch panel, mouse, keyboard, operation terminal and the like may be connected as the input/output device 225 to the controller 221. Also, a display may be, for example, connected as a display unit to the controller 221.

For example, the memory device 221c includes a flash memory, a hard disk drive (HDD), and a CD-ROM. A control program configured to control operation of the substrate processing apparatus 100 and a process recipe describing the order and conditions for processing a substrate are stored in the memory device 221c so that the control program and the process recipe is read from the memory device 221c. Also, the process recipe is combined so that predetermined results is obtained by executing the respective procedures at the controller 221 in a substrate processing process as will be described below, and thus functions as a program. Hereinafter, both of the process recipe and the control program are simply referred to as a program. Also, when the term "program" is used in this specification, there are cases in which the program includes only a single process recipe, includes only a single control program, or includes both of the process recipe and the control program. Also, the RAM 221b is configured as a memory area (work area) to temporarily hold a program or data read by the CPU 221a.

The I/O port 221d is connected to the mass flow controllers 252a to 252c, the valves 211 and 243, the APC 242, the vacuum pump 246, the heater 217b, the matching transformer 272, the high-frequency power source 273, the susceptor lift mechanism 268, and the impedance variation mechanism 274, as described above.

The CPU 221a is configured to read the process recipe from the memory device 221c according to input of an operation command from the input/output device 281 while reading the control program from the memory device 221c and executing the control program. Based on the read contents of the process recipe, the CPU 221a is configured to control an operation of adjusting an opening degree of the APC 242 and an opening/closing operation of the valve 243 and start/stop of the vacuum pump 246 through a signal line A, a raising/lowering operation of the susceptor lift mechanism 268 through a signal line B, an operation of adjusting electric power supplied into the heater 217b (a temperature-adjusting operation) based on a temperature sensor or an operation of adjusting an impedance value by means of the impedance variation mechanism 274 through a signal line C, an opening/closing operation of the gate valve 244 through a signal line D, operations of the matching transformer 272 and the high-frequency power source 273 through a signal line E, and an operation of adjusting flow rates of a variety of gases by means of the mass flow controllers 252a to 252c and an opening/closing operation of the valves 253a to 253c through a signal line F.

Meanwhile, the present invention is not limited to a case in which the controller 221 is configured as a dedicated computer. The controller 221 may be configured as a general-purpose computer. For example, the controller 221 according to this embodiment may be configured by preparing an external memory device 226 in which the above-described program is stored (for example, a magnetic disk such as a magnetic tape, a flexible disk or a hard disk, an optical disc such as CD or DVD, an optical magnetic disc such as MO, or a semiconductor memory such as a USB memory or a memory card), and installing a program on a general-purpose computer using the related external memory device 226. Also, a method of supplying a program to a computer is not limited to a case in which the program is supplied to the computer via the external memory device 226. For example, the program may be supplied using a communication means such as the Internet or a dedicated line without using the external memory device 226. Also, the memory device 221c or the external memory device 226 is configured as a computer-readable recording medium. Hereinafter, these devices are simply referred to as a recording medium. Also, when the term "recording medium" is used in this specification, there are cases in which the recording medium includes only a single memory device 221c, includes only an external memory device 226, or includes both of the memory device 221c and the external memory device 226.

(2) Substrate Processing Process

Figure 2:
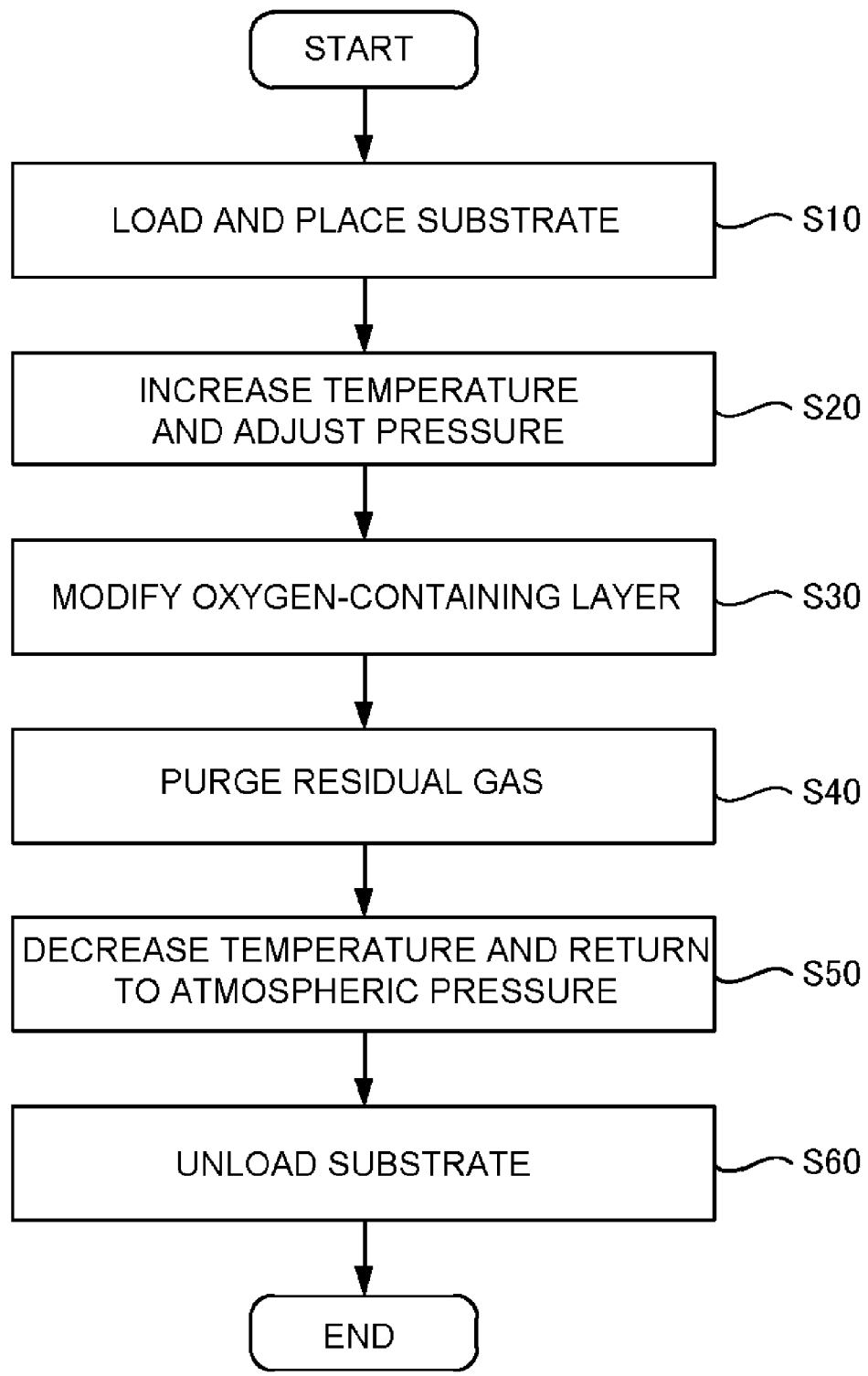
FIG. 2 is a flowchart showing a substrate processing process according to one embodiment of the present invention.
Figure 3:
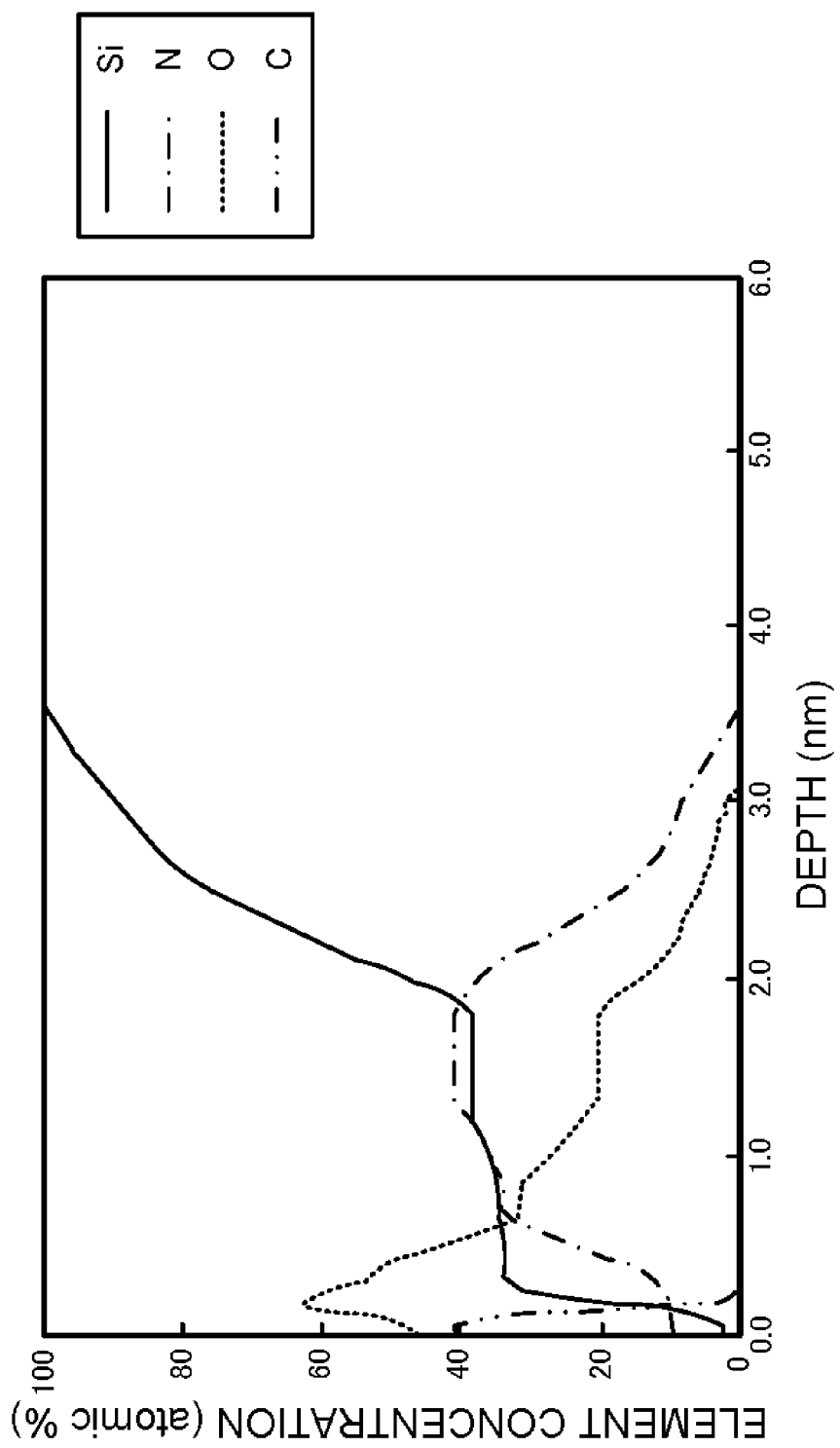
FIG. 3 is a graph illustrating the composition analysis results of an oxynitride layer in a depth direction according to Example 1 of the present invention.
Figure 4:
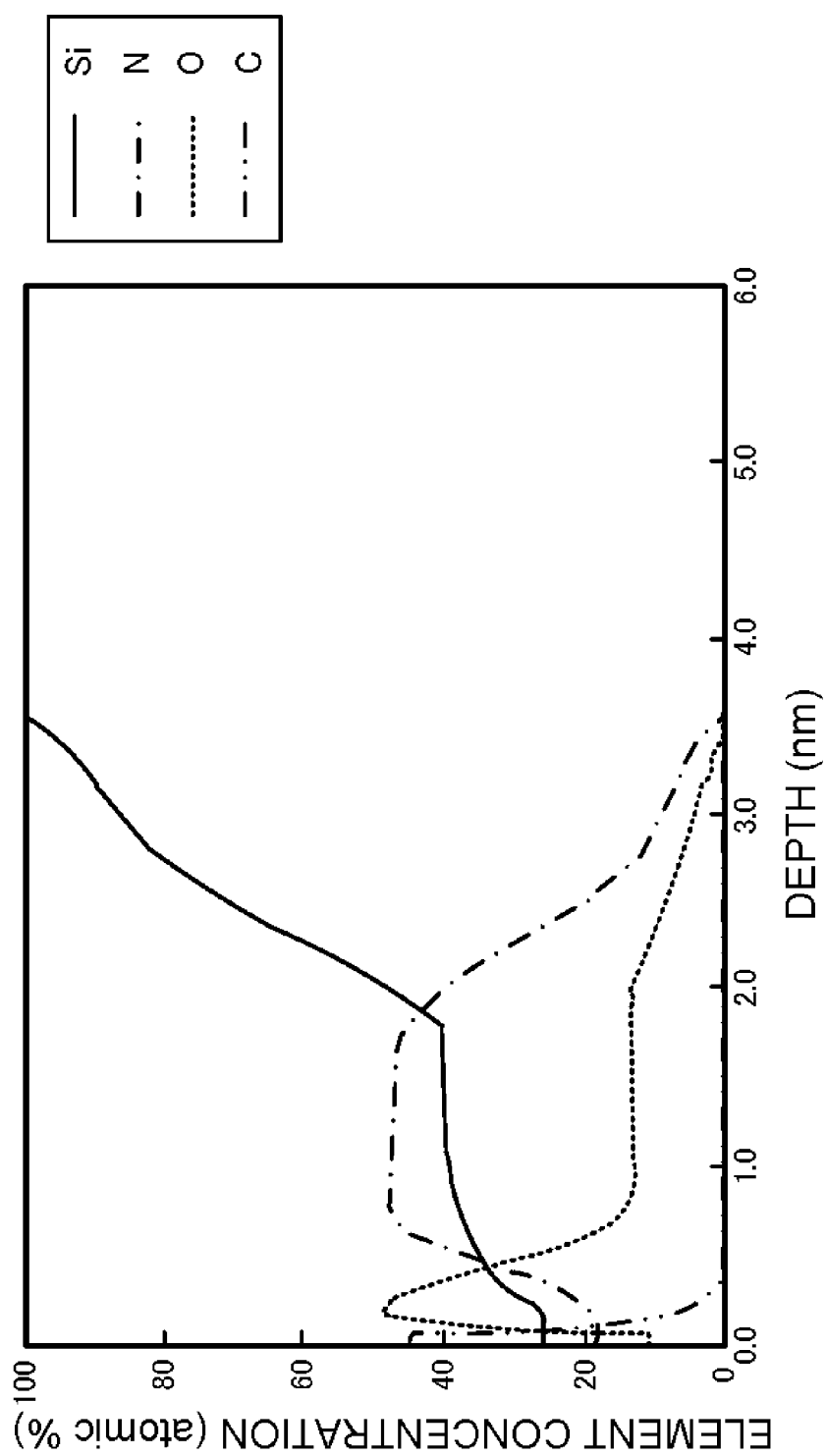
FIG. 4 is a graph illustrating the composition analysis results of an oxynitride layer in a depth direction according to Example 2 of the present invention.
Figure 5:
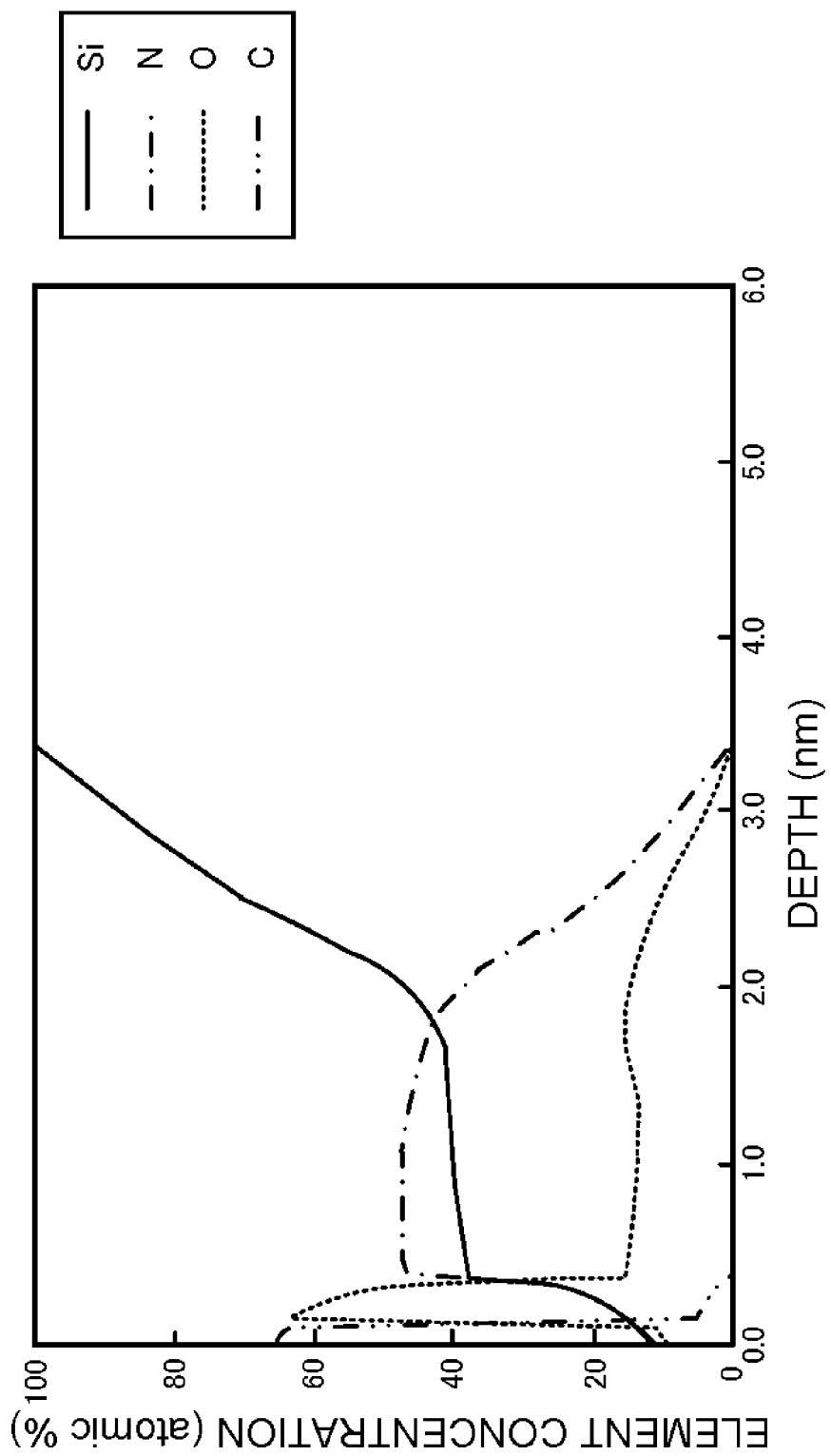
FIG. 5 is a graph illustrating the composition analysis results of an oxynitride layer in a depth direction according to Example 3 of the present invention.

Next, a substrate processing process that is carried out as one semiconductor manufacturing process according to this embodiment will be described with reference to FIG. 2. This process is carried out using the above-described substrate processing apparatus 100 which is configured as the MMT apparatus. Also, in the following description, operations of respective parts constituting the substrate processing apparatus 100 are controlled by the controller 221.

Here, one case in which an oxygen-containing layer is modified into an oxynitride layer or a nitride layer when the wafer 200 which includes a polysilicon film having the oxygen-containing layer formed thereon, is processed using ammonia ($NH_3$) gas as a process gas containing nitrogen and hydrogen atoms and the nitrogen atoms are introduced into the polysilicon film is described.

[Substrate Loading/Placing Operation (S10)]

First, the susceptor 217 is lowered to a transfer position of the wafer 200 so that the wafer lift pin 266 passes through the through hole 217a of the susceptor 217. As a result, the lift pin 266 protrudes from a surface of the susceptor 217 by a predetermined height. Next, the gate valve 244 is opened, and the wafer 200 is loaded into the process chamber 201 using a transfer mechanism (not shown). As a result, the wafer 200 is supported in a horizontal posture on the wafer lift pin 266 protruding from the surface of the susceptor 217.

A polysilicon film is formed in advance on a surface of the wafer 200. For example, the polysilicon film is formed using a chemical vapor deposition (CVD) method or an atomic layer deposition (ALD) method of supplying a silicon (Si) source such as monosilane ($SiH_4$) gas and hydrogen gas ($H_2$ gas) to the surface of the wafer 200.

The polysilicon film has an oxygen-containing layer formed on a surface thereof. For example, the oxygen-containing layer is a native oxide layer formed on the polysilicon film by oxygen ($O_2$) in the atmosphere when the oxygen-containing layer is exposed to the atmosphere during transfer of the wafer 200. A thickness of the oxygen-containing layer is, for example, in a range of 0.5 nm to 2.0 nm. When the thickness of the oxygen-containing layer exceeds 0.5 nm, an effect of modifying an oxygen-containing layer as will be described below into an oxynitride layer or a nitride layer may be easily obtained.

When the wafer 200 is loaded into the process chamber 201, the transfer mechanism is evacuated from the process chamber 201, and the gate valve 244 is closed to hermetically close the process chamber 201. The susceptor lift mechanism 268 is used to raise the susceptor 217. As a result, the wafer 200 is disposed on a surface of the susceptor 217. Thereafter, the wafer 200 is raised to a predetermined processing position by raising the susceptor 217 to a predetermined position.

Also, when the wafer 200 is loaded into the process chamber 201, Ar gas serving as a purge gas may be supplied from the gas supply unit into the process chamber 201 while exhausting an inside of the process chamber 201 using the exhaust unit. That is, the inside of the process chamber 201 is exhausted by driving the vacuum pump 246 and opening the valve 243. At the same time, the valve 253c may be opened to supply the Ar gas into the process chamber 201 via the buffer chamber 237. Therefore, invasion of particles into the process chamber 201 or attachment of particles to the wafer 200 may be inhibited. Also, the vacuum pump 246 is always driven until a substrate unloading operation (S60) as will be described below is finished at least from the substrate loading/placing operation (S10).

[Heating/Pressure Adjusting Operation (S20)]

Next, electric power is supplied to the heater 217b installed inside the susceptor 217 to heat a surface of the wafer 200 to a predetermined temperature. In this case, the wafer 200 is maintained at a temperature of 350° C. to 700° C., preferably 450° C. to 700° C. When the wafer 200 is maintained at a temperature of 350° C. or more, preferably a temperature of 450° C., for example, the oxygen-containing layer may be modified into an oxynitride layer or a nitride layer, as will be described below. In this case, when the modification is performed to a certain extent, an intake of the excited hydrogen atoms into the oxygen-containing layer may be reduced. In this case, a temperature of the heater 217b is regulated by controlling an electric power supplied to the heater 217b based on the temperature information detected by a temperature sensor (not shown).

Also, a pressure is regulated by the APC 242 so that an inside of the process chamber 201 can reach a desired pressure (for example, a range of 1 Pa to 100 Pa, preferably 20 Pa to 100 Pa). In this case, the pressure in the process chamber 201 is measured using a pressure sensor (not shown), and an opening degree of the APC 242 is feedback-controlled based on the measured pressure information.

[Modification Operation (S30)]

Here, one case in which $NH_3$ gas is, for example, used as the process gas containing nitrogen and hydrogen atoms will be described. That is, the $NH_3$ gas serving as the nitrogen-containing gas functions as a hydrogen-containing gas according to this embodiment.

First, the valve 253a is opened, and the $NH_3$ gas serving as the process gas is supplied through the nitrogen-containing gas supply pipe 232a into the process chamber 201 via the buffer chamber 237. In this case, a flow rate of the $NH_3$ gas is adjusted by the mass flow controller 252a so that the flow rate of the $NH_3$ gas can reach a predetermined flow rate (for example, a flow rate of 50 sccm to 1,000 sccm, preferably 100 sccm to 1,000 sccm).

In a place in which a magnetic field is formed by the upper magnet 216a and the lower magnet 216b after the supply of the $NH_3$ gas is initiated, a predetermined high-frequency electric power (for example, a voltage of 100 W to 1,000 W, preferably 100 W to 800 W) is applied from the high-frequency power source 273 to the tubular electrode 215 via the matching transformer 272. As a result, a magnetron discharge is generated in the process chamber 201, and a high-density plasma is generated at the plasma-generating region 224 arranged above the wafer 200. In this case, the impedance variation mechanism 274 is controlled in advance to have a desired impedance value.

When the plasma is generated in the process chamber 201 as described above, the $NH_3$ gas supplied into the process chamber 201 is excited and activated. Active species (for example, nitrogen radicals (N*), hydrogen radicals (H*), ammonium ions ($NH_4^+$), etc.) are supplied to the polysilicon film and the oxygen-containing layer disposed on the wafer 200. Thus, oxygen (O) atoms are removed (separated) from the polysilicon film and the oxygen-containing layer. When the separated oxygen (O) atoms are replaced with nitrogen (N) atoms, nitridation of a surface of the polysilicon film and nitridation of the oxygen-containing layer are facilitated.

That is, when the active species containing nitrogen (N) atoms such as nitrogen radicals (N*) are supplied to the polysilicon film, a surface of the polysilicon film may be nitrided. Also, the nitrogen radicals (N*) have an effect of separating and removing oxygen (O) atoms from the polysilicon film, for example, using sputtering so as to have high energy. Nitrogen (N) atoms bind to dangling bonds generated when the oxygen (O) atoms are separated by a sputtering effect, thereby further facilitating nitridation of the surface of the polysilicon film.

In this case, when the active species containing hydrogen (H) atoms such as hydrogen radicals (H*) are supplied to the oxygen-containing layer, the oxygen (O) atoms included in the oxygen-containing layer are separated by a hydrogen reduction reaction. Then, nitrogen (N) atoms bind to dangling bonds generated when the oxygen (O) atoms are separated, and nitridation of the oxygen-containing layer is facilitated, thereby modifying the oxygen-containing layer into an oxynitride layer or a nitride layer. As a result, the oxygen-containing layer may be modified into an oxynitride layer or a nitride layer having a high nitrogen concentration.

When modification of the oxygen-containing layer is finished with lapse of a predetermined processing time, the supply of an electric power to the tubular electrode 215 is stopped. Then, the valve 253a is closed to stop the supply of the NH$_3$ gas into the process chamber 201.

[Purging Operation (S40)]

When the above-described modification operation (S30) is completed, an inside of the process chamber 201 continues to be exhausted using the gas exhaust pipe 231 when the valve 243 is kept open so as to discharge a residual gas in the process chamber 201. That is, until a concentration of the process gas in the process chamber 201 reaches a concentration equal to or less than a predetermined value, the inside of the process chamber 201 is exhausted to discharge the residual gas. For example, the inside of the process chamber 201 is exhausted until the concentration of the process gas reaches a concentration at which a substrate unloading operation (S60) as will be described below is performed for unloading the wafer 200 from the process chamber 201. Also, for example, the inside of the process chamber 201 may be exhausted until the process gas is free from at least a surface of the wafer 200. In this case, the discharging of the residual gas from the process chamber 201 may be facilitated by opening the valve 253c and supplying an inert gas such as Ar gas serving as a purge gas into the process chamber 201.

[Temperature Lowering/Atmospheric Pressure Returning Operation (S50)]

When the purging operation (S40) is completed, an opening degree of the APC 242 is adjusted to return a pressure in the process chamber 201 to atmospheric pressure, and also lower a temperature of the wafer 200 to a predetermined temperature. More particularly, the pressure in the process chamber 201 is increased to atmospheric pressure by controlling opening/closing of the APC 242 and the valve 243 of the exhaust unit based on the pressure information detected by a pressure sensor (not shown) while supplying the Ar gas serving as the inert gas into the process chamber 201 when the valve 253c is kept open. Then, a temperature of the wafer 200 is lowered by controlling an electric power supplied to the heater 217b.

[Substrate Unloading Operation (S60)]

Subsequently, the wafer 200 is supported by the wafer lift pin 266 protruding from a surface of the susceptor 217 by lowering the susceptor 217 to a transfer position of the wafer 200. Then, the gate valve 244 is opened, and the wafer 200 is unloaded from the process chamber 201 using a transfer mechanism (not shown). As a result, the substrate processing process according to this embodiment is finished. As described above, the conditions such as a temperature of the wafer 200, a pressure in the process chamber 201, a flow rate of each gas, an electric power applied to the tubular electrode 215, and a processing time are optionally adjusted according to a material of a layer to be modified, a thickness of a layer, etc.

(3) Effects According to this Embodiment

According to this embodiment, one or a plurality of the following effects are achieved.

(a) This embodiment is configured so that the process gas containing nitrogen and hydrogen atoms is supplied into the process chamber 201 using the gas supply unit and excited using the excitation unit, and the excited process gas is supplied to a surface of the wafer 200 which includes a polysilicon film having an oxygen-containing layer formed thereon. Therefore, in addition to nitriding a surface of the polysilicon film, the oxygen-containing layer of the polysilicon film may be modified into an oxynitride layer or a nitride layer having a high nitrogen concentration (that is, a low oxygen concentration).

As a result, oxidation resistance of the polysilicon film may be improved. Therefore, when the processed wafer 200 according to this embodiment is, for example, formed on a flash memory, that is, when the thin film having an ONO structure as described above is formed on the wafer 200 and etched, and recovered by oxidation, formation of bird beaks between the polysilicon film and the thin film having an ONO structure may be inhibited. As a result, when the processed wafer 200 according to this embodiment becomes a flash memory, for example, input and erasing characteristics of electrons may be improved.

(b) According to this embodiment, when the excited nitrogen and hydrogen atoms are supplied to the wafer 200 which includes a polysilicon film having a native oxide layer formed thereon as the oxygen-containing layer, the native oxide layer may be modified into an oxynitride layer or a nitride layer, and a surface of the polysilicon film may be nitride at the same time.

(c) According to this embodiment, the wafer 200 is heated using the heater 217b so that a surface temperature of the wafer 200 can reach a temperature of 350° C. to 700° C. As a result, the oxygen-containing layer is, for example, modified into an oxynitride layer or a nitride layer. In this case, when the modification is performed to a certain extent, the intake of the excited hydrogen atoms into the oxygen-containing layer may be reduced.

Another Embodiment of the Present Invention

Although the embodiments of the present invention have been described in detail, the present invention is not limited to the above-described embodiment, and can be variously modified without departing from the scope of the present invention. Hereinafter, other embodiments of the present invention will be described. In this embodiment, the wafer 200 is also processed, using the MMT apparatus as the substrate processing apparatus, by exciting the process gas.

In the above-described embodiments, the wafer 200 which includes a polysilicon film having a native oxide layer formed thereon as the oxygen-containing layer is used to modify the oxygen-containing layer into an oxynitride layer or nitride layer having a high nitrogen concentration, and simultaneously nitride a surface of the polysilicon film.

However, the native oxide layer may have different thicknesses according to a circuit pattern formed on a surface of the wafer 200, the kind of the wafer 200, the kind of a film formed on a surface of the wafer 200, and a leaving time of the wafer 200. Thus, a thickness of the surface of the wafer 200 may not be controlled so that the surface of the wafer 200 can have a uniform thickness distribution.

Therefore, after the native oxide layer formed on the wafer 200 is removed using diluted hydrofluoric acid (DHF, obtained by diluting hydrofluoric acid (HF) with pure water), for example, a pre-cleaning process of removing impurities such as metals or organic matters using ozone water, may be performed on the wafer 200. When the surface of the wafer 200 is pre-cleaned as described above, the above-described uneven native oxide layer may be removed. However, the oxygen-containing layer such as a chemical oxide layer may be formed on the polysilicon film. However, even the chemical oxide layer may interfere with formation of a high-concentration nitride layer on the polysilicon film.

Accordingly, in this embodiment, the wafer 200 which includes a polysilicon film having an oxygen-containing layer formed thereon as the chemical oxide layer is used, and the oxygen-containing layer is modified into an oxynitride layer or nitride layer having a high nitrogen concentration by supplying a process gas containing nitrogen and hydrogen atoms.

Since the chemical oxide layer is formed by the pre-cleaning process under the constant conditions unlike the above-described native oxide layer, the chemical oxide layer formed on every wafer 200 has a uniform thickness. Thus, a thickness of the chemical oxide layer may be controlled so that the chemical oxide layer can be uniformly distributed on the surface of the wafer 200. The chemical oxide layer has a thickness of approximately 0.5 nm to 2 nm, and a thickness of 1 nm on average. Therefore, when the process gas containing nitrogen and hydrogen atoms is supplied into the process chamber 201 using the gas supply unit and excited using the excitation unit, and the excited process gas is supplied to the wafer 200 which includes a polysilicon film having a chemical oxide layer formed thereon as the oxygen-containing layer, the chemical oxide layer may be modified into an oxynitride layer or nitride layer having a high nitrogen concentration, and a surface of the polysilicon film may be uniformly nitrided with good reproducibility.

Also, when the chemical oxide layer is formed on the polysilicon film provided in the wafer 200, formation of the native oxide layer on the polysilicon film may be inhibited.

Still Another Embodiment

Although the embodiments have been described above, the present invention is not limited to the above-described embodiments, and can be variously modified without departing from the scope of the present invention.

In the above-described embodiments, one case in which the ammonia gas ($NH_3$ gas) is used as the process gas containing nitrogen and hydrogen atoms has been described, but the present invention is not limited to the above-described embodiments. That is, for example, monomethylhydrazine gas ($CH_6N_2$ gas) may be used as the process gas containing nitrogen and hydrogen atoms.

For example, a gas obtained, for example, by mixing a nitrogen-containing gas and a hydrogen-containing gas may also be used as the process gas. More particularly, ammonia gas ($NH_3$ gas) or nitrogen gas ($N_2$ gas) may be, for example, used as the nitrogen-containing gas, and hydrogen gas ($H_2$ gas) may be, for example, used as the hydrogen-containing gas. That is, as shown in FIG. 1, the valve 253a may be opened to supply the $NH_3$ gas into the process chamber 201 through the nitrogen-containing gas supply pipe 232a. At the same time, the valve 253b may be opened to supply the $H_2$ gas into the process chamber 201 through the hydrogen-containing gas supply pipe 232b. As a result, since nitrogen radicals (N*) and hydrogen radicals (H*) may be supplied to the wafer 200 which includes a polysilicon film having an oxygen-containing layer formed thereon, the oxygen-containing layer may be modified into an oxynitride layer or nitride layer in addition to nitridation of the polysilicon film.

In this case, the mass flow controllers 252a and 252b are controlled so that a ratio of hydrogen (H) atoms of active species containing hydrogen among the active species included in the excited process gas can be in a range of 10% to 90%, and thus a ratio between a flow rate of the nitrogen-containing gas such as $NH_3$ gas and a flow rate of the hydrogen-containing gas such as $H_2$ gas may be adjusted. As a result, the wafer 200 may be uniformly processed according to a thickness of the oxygen-containing layer, and a content of oxygen in the oxygen-containing layer.

Also, the mass flow controllers 252a and 252b may be adjusted so that the sum of the flow rates of the nitrogen-containing gas such as $NH_3$ gas and the hydrogen-containing gas such as $H_2$ gas can be in a range of 100 sccm to 1,000 sccm. In this case, for example, when the oxygen-containing layer is modified into an oxynitride layer or a nitride layer, a ratio between a flow rate of the $NH_3$ gas and a flow rate of the $H_2$ gas may be dynamically adjusted in the early stage of modification, for example, a flow rate of the $H_2$ gas may be higher than that of the $NH_3$ gas.

In addition, when the process gas is supplied into the process chamber 201, the Ar gas serving as the inert gas may be supplied together into the process chamber 201 via the buffer chamber 237 by opening the valve 253c and adjusting the flow rate using the mass flow controller 252c. Therefore, the conditions such as a concentration and a flow velocity of a gas supplied into the process chamber 201 may be freely adjusted with no variation in the flow rates and ratios of the nitrogen-containing gas and the hydrogen-containing gas.

Figure 7:
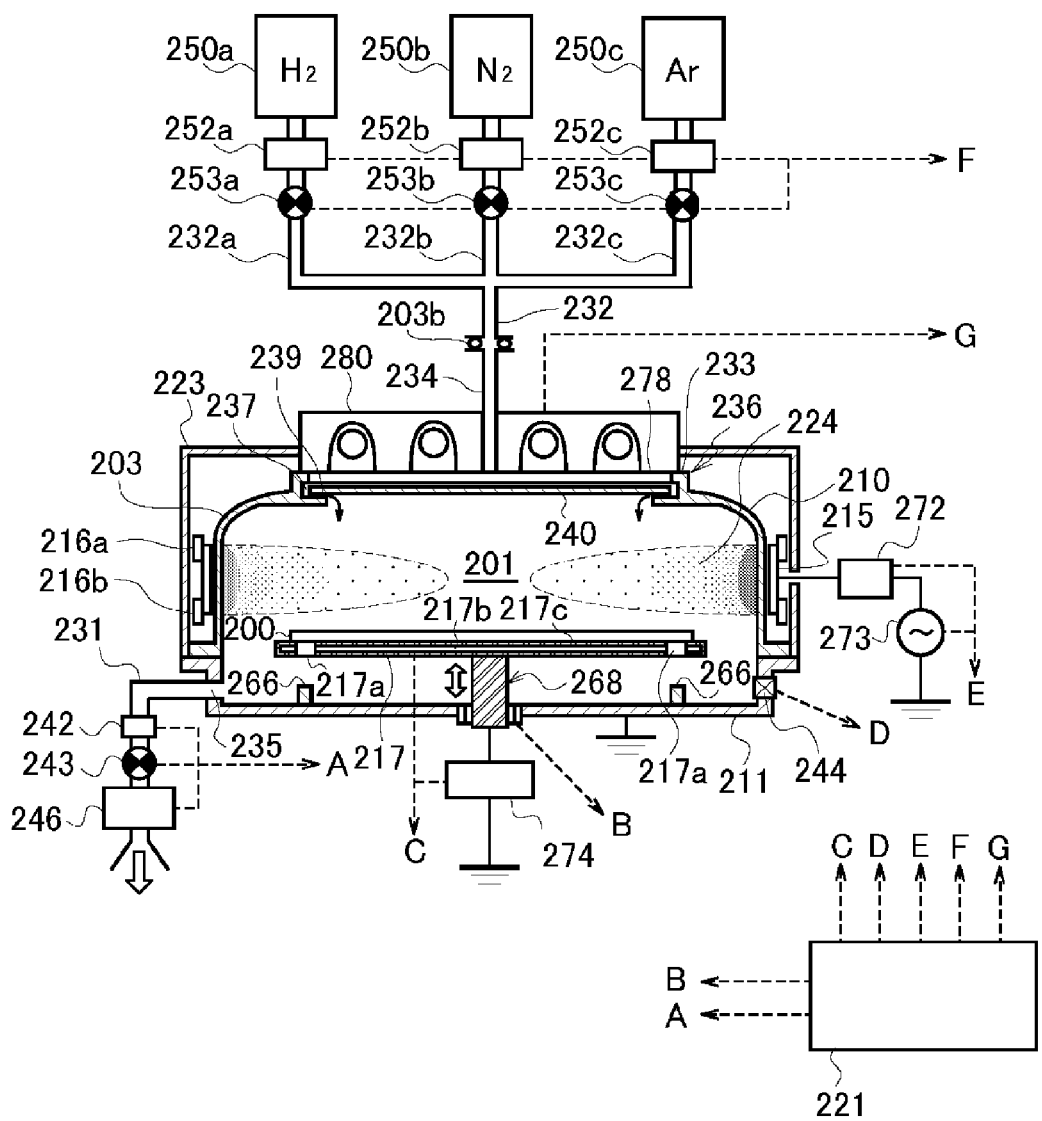
FIG. 7 is a schematic cross-sectional view of a substrate processing apparatus including a lamp heating unit according to another embodiment of the present invention.

Also, although the wafer 200 is configured to be heated by the heater 217b installed inside the susceptor 217 in the above-described embodiments, the present invention is not limited to the embodiments. For example, as shown in FIG. 7, the wafer 200 may be heated by irradiation with infrared rays from a lamp heating unit 280 in addition to the heater 217b. In this case, the lamp heating unit 280 may be configured to irradiate an inside of the process chamber 201 with light via a light transmitting window 278 installed above the process chamber 201, that is, installed on a surface of the upper container 210. When the lamp heating unit 280 is used together with the heater 217b, the wafer 200 may be heated in a shorter time compared to when the wafer 200 is heated using only the heater 217b. Also, the wafer 200 may be heated using only the lamp heating unit 280 without installing the heater 217b. Also, the lamp heating unit 280 is configured to be controlled by the controller 221 through the signal line G.

Furthermore, in the above-described embodiments, one case in which the wafer 200 is processed using the substrate processing apparatus 100 configured as the MMT apparatus has been described, but the present invention is not limited thereto. For example, the substrate processing operation may be performed using an inductively coupled plasma (ICP) device or an electron cyclotron resonance (ECR) device.

Figure 8:
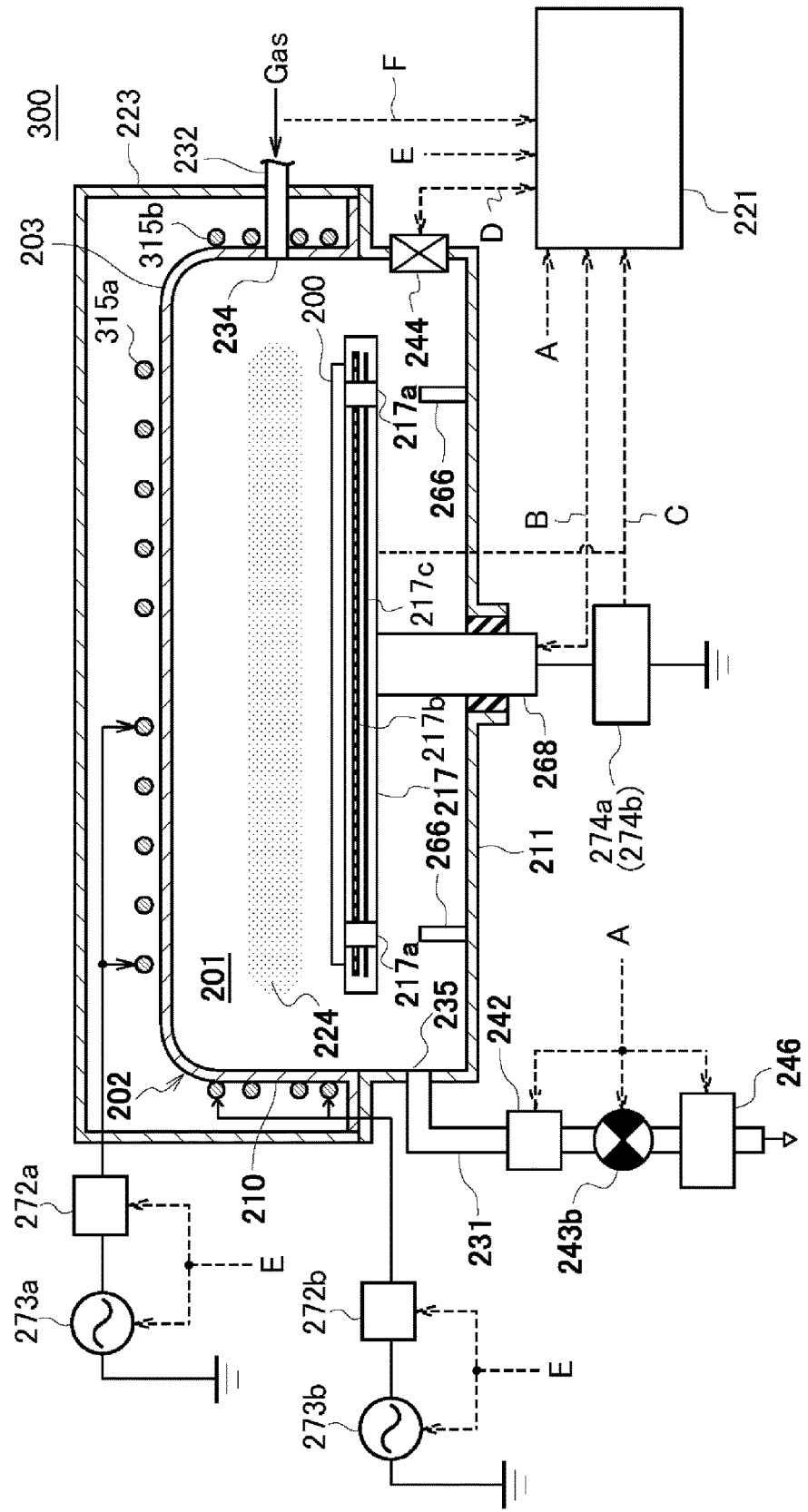
FIG. 8 is a schematic cross-sectional view of an ICP-type plasma processing device as the substrate processing apparatus according to another embodiment of the present invention.

FIG. 8 shows an ICP-type plasma processing device 300 that is the substrate processing apparatus according to another embodiment of the present invention. For the requirements of components having the same functions as in the embodiments, the components having the same functions have the same reference numerals. Therefore, detailed description of the configuration according to this embodiment is omitted. Also, illustration of the gas supply unit is omitted. The ICP-type plasma processing device 300 according to this embodiment generates plasma by supplying an electric power via each of matching transformers 272a and 272b, high-frequency power sources 273a and 273b and dielectric coils 315a and 315b. The dielectric coil 315a is arranged outside a ceiling side of the processing container 203. The dielectric coil 315b is arranged outside an external circumferential wall of the processing container 203. According to this embodiment, the process gas containing nitrogen and hydrogen atoms is supplied through the gas supply pipe 232 into the process chamber 201 via the gas introduction section 234. Also, when high-frequency electric power flows in the dielectric coils 315a and 315b before/after the supply of a gas, an electric field is formed by induction of electrons. When the electric field is used as energy, active species may be generated by exciting the supplied process gas into a plasma state.

Figure 9:
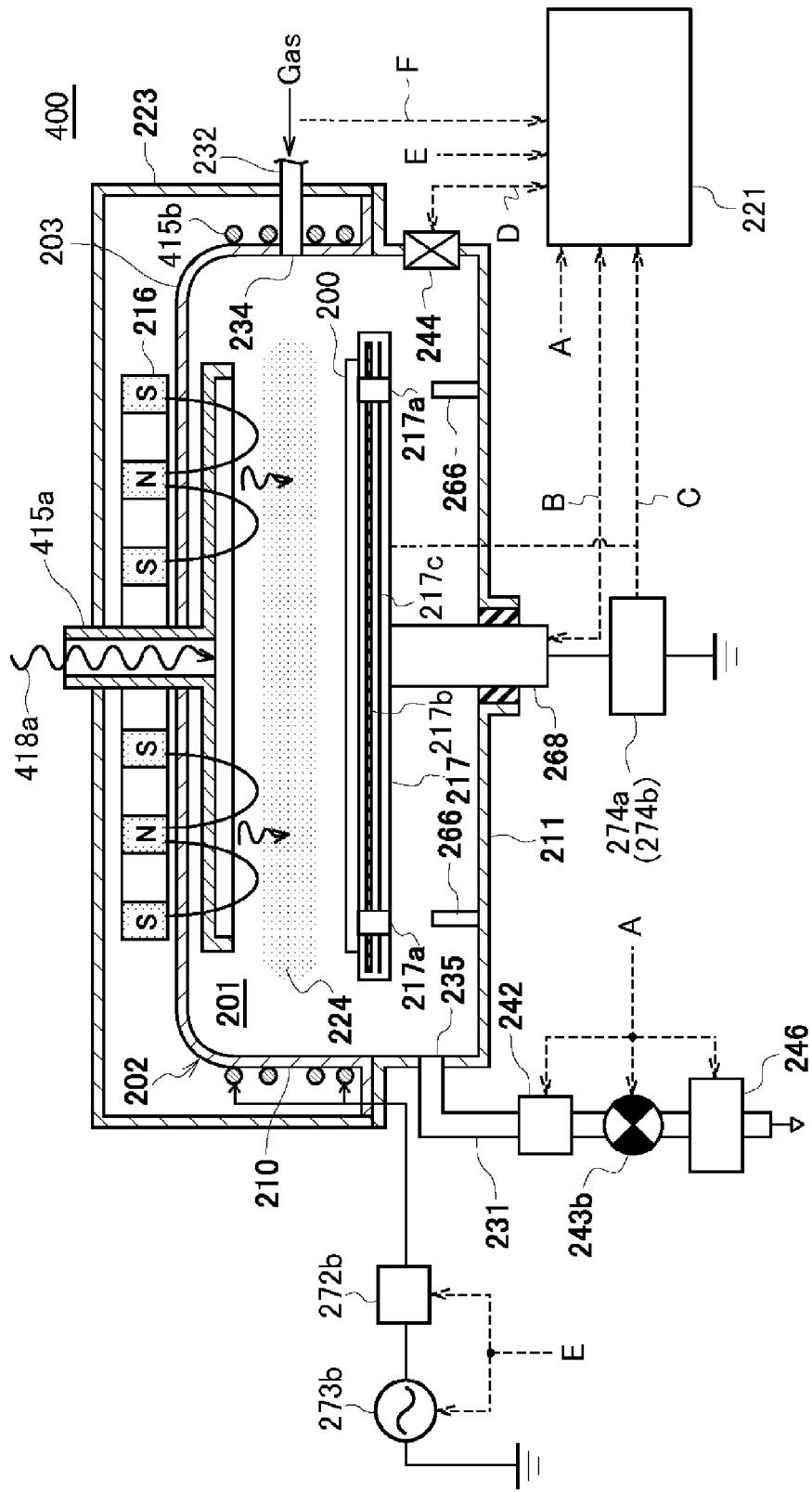
FIG. 9 is a schematic cross-sectional view of an ECR-type plasma processing device as the substrate processing apparatus according to still another embodiment of the present invention.

FIG. 9 shows an ECR-type plasma processing device 400 that is the substrate processing apparatus according to still another embodiment of the present invention. For the requirements of components having the same functions as in the embodiments, the components having the same functions have the same reference numerals. Therefore, detailed description of the configuration according to this embodiment is omitted. Also, illustration of the gas supply unit is omitted. The ECR-type plasma processing device 400 according to this embodiment includes a matching transformer 272b configured to supply microwaves to generate plasma, a high-frequency power source 273b, a microwave introduction pipe 415a and a dielectric coil 415b. The microwave introduction pipe 415a is arranged outside a ceiling wall of the processing container 203. The dielectric coil 415b is arranged outside an external circumferential wall of the processing container 203. According to this embodiment, the process gas containing nitrogen and hydrogen atoms is supplied through the gas supply pipe 232 into the process chamber 201 via the gas introduction section 234. Also, microwaves 418a are introduced into the microwave introduction pipe 415a before/after the supply of the gas, and the microwaves 418a are emitted to the process chamber 201. The active species may be generated by the high-frequency electric power from the microwaves 418a and the dielectric coil 415b by exciting the supplied process gas into a plasma state.

EXAMPLES

Hereinafter, Examples of the present invention will be described with reference to FIGS. 3 to 6.

In Examples of the present invention, NH3 gas excited by an excitation unit was supplied to a wafer 200 which included a polysilicon film having an oxygen-containing layer formed thereon, the wafer 200 was heated to 350° C., and substrate processing was performed to modify an oxygen-containing layer into an oxynitride layer (Example 1). Also, substrate processing was performed under the same conditions as in Example 1 to modify an oxygen-containing layer into an oxynitride layer (Example 2), except that a heating temperature of the wafer 200 was set to 450° C. Substrate processing was performed under the same conditions as in Example 1 to modify an oxygen-containing layer into an oxynitride layer (Example 3), except that a heating temperature of the wafer 200 was set to 550° C. Also, a case in which an N2 gas excited by an excitation unit was supplied to a wafer which included a polysilicon film having an oxygen-containing layer formed thereon, the wafer was heated to 350° C., and substrate processing was performed to modify an oxygen-containing layer into an oxynitride layer is described as Comparative Example.

For Examples 1 to 3 and Comparative Example as described above, the composition analysis of the oxynitride layers formed by the modification in a thickness direction was performed. The results are shown in FIGS. 3 to 6. That is, FIGS. 3 to 6 are graphs illustrating the element concentrations (atomic %) of the oxynitride layers in a depth direction when the oxynitride layers according to Examples 1 to 3 and Comparative Example of the present invention were measured using high resolution-Rutherford backscattering spectrometry (HR-RBS).

Next, the compositional ratios of the above-described oxynitride layers of Examples 1 to 3 and Comparative Example are listed in Table 1. Table 1 lists the compositions (atomic %) of a silicon element (Si), an oxygen element (O) and a nitrogen element (N) in each of the oxynitride layers of Examples 1 to 3 and Comparative Example, which are calculated from FIGS. 3 to 6.

TABLE 1

| | compositions (atomic %) | | |
|---|---|---|---|
| | silicon element | oxygen element | nitrogen element |
| Example 1 | 41.4 | 25.6 | 32.9 |
| Example 2 | 42.7 | 15.2 | 42.1 |
| Example 3 | 43.3 | 14.1 | 42.6 |
| Comparative Example | 42.8 | 22.8 | 34.4 |

Figure 6:
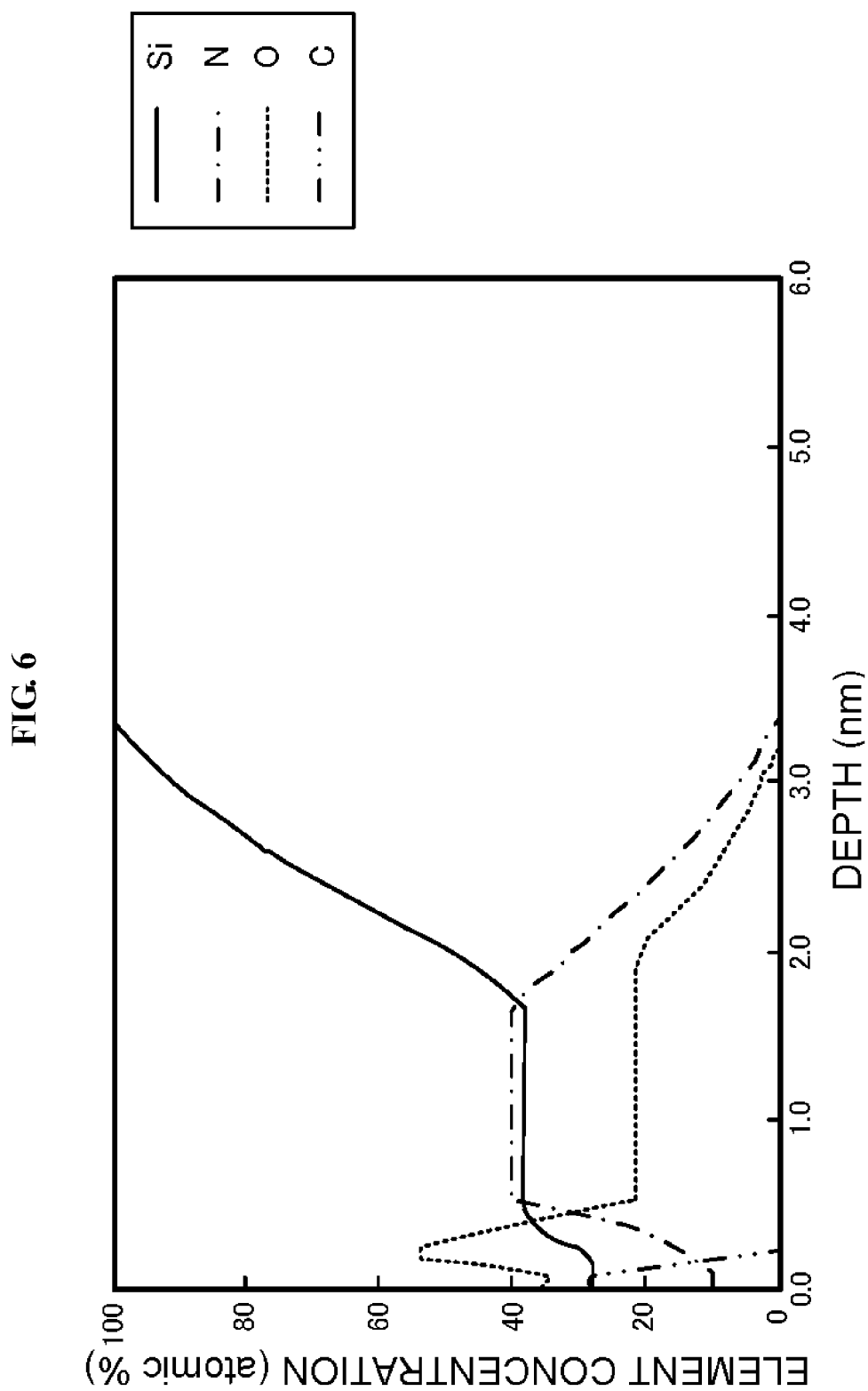
FIG. 6 is a graph illustrating the composition analysis results of an oxynitride layer in a depth direction according to Comparative Example.

As described in Example 2 (FIG. 4) and Example 3 (FIG. 5), it could be seen that, in modification in which a heating temperature of the wafer 200 was 450° C. or more, the oxygen-containing layer could be modified into an oxynitride layer having a lower oxygen concentration and higher nitrogen concentration, compared with Comparative Example (FIG. 6). Also, as described in Example 1 (FIG. 3), it could be seen that even when the modification in which the heating temperature of the wafer 200 was 350° C. was performed, a slight effect of lowering an oxygen concentration and increasing a nitrogen concentration was expected when a depth was 2 nm or more. As described above, it could be seen from FIGS. 3 to 6 and Table 1 that the oxygen-containing layer might be modified into an oxynitride layer having a high nitrogen concentration by supplying a process gas containing nitrogen and hydrogen atoms to the wafer 200 which included the polysilicon film having an oxygen-containing layer formed thereon so as to perform the modification on the oxygen-containing layer.

Preferred Embodiments of the Present Invention

Hereinafter, preferred embodiments of the present invention will be further stated.

According to one embodiment of the present invention, there is provided a substrate processing apparatus including: a process chamber accommodating a substrate including a polysilicon film having an oxygen-containing layer formed thereon; a heating unit installed in the process chamber to heat the substrate; a gas supply unit configured to supply a process gas containing nitrogen and hydrogen to the substrate in the process chamber; an excitation unit configured to excite the process gas supplied into the process chamber; an exhaust unit configured to exhaust an inside of the process chamber; and a control unit configured to control at least the heating unit, the gas supply unit, the excitation unit and the exhaust unit so as to modify the oxygen-containing layer into an oxynitride layer or a nitride layer by heating the substrate to a predetermined temperature using the heating unit, exciting the process gas supplied by the gas supply unit using the excitation unit, and supplying the process gas excited by the excitation unit to the substrate.

Preferably, the oxygen-containing layer is a native oxide layer.

Preferably, the oxygen-containing layer is an oxide layer formed by cleaning the substrate.

Also, preferably, the predetermined temperature is in a range of 350° C. to 700° C.

Also, preferably, the control unit controls a ratio of hydrogen atoms of active species containing hydrogen among the active species included in the process gas excited by the excitation unit such that the ratio ranges from 10% to 90%.

Also, preferably, the oxygen-containing layer has a thickness ranging from 0.5 nm to 2.0 nm.

According to another embodiment, there is provided a method of manufacturing a semiconductor device including: loading a substrate into a process chamber, the substrate including a polysilicon film having an oxygen-containing layer formed thereon; supplying a process gas containing nitrogen and hydrogen into the process chamber while heating the substrate and exhausting an inside of the process chamber; and modifying the oxygen-containing layer into an oxynitride layer or a nitride layer by exciting the process gas supplied into the process chamber and supplying an excited process gas to a surface of the substrate.

According to another embodiment, a method of manufacturing a semiconductor device including loading a substrate into a process chamber, the substrate including a polysilicon film having an oxygen-containing layer formed thereon; heating the substrate; supplying a process gas containing nitrogen and hydrogen into the process chamber; and modifying the oxygen-containing layer into an oxynitride layer or a nitride layer by exciting the process gas supplied into the process chamber and supplying an excited process gas to a surface of the substrate.

According to still another embodiment, there is provided a program for sequentially executing procedures in a computer, the procedures including: loading a substrate into a process chamber, the substrate including a polysilicon film having an oxygen-containing layer formed thereon; supplying a process gas containing nitrogen and hydrogen into the process chamber while heating the substrate and exhausting an inside of the process chamber; and modifying the oxygen-containing layer into an oxynitride layer or a nitride layer by exciting the process gas supplied into the process chamber and supplying an excited process gas to a surface of the substrate.

According to still another embodiment, there is provided a non-transitory computer-readable recording medium storing a program that causes a computer to perform a process, the process including: loading a substrate into a process chamber, the substrate including a polysilicon film having an oxygen-containing layer formed thereon; supplying a process gas containing nitrogen and hydrogen into the process chamber while heating the substrate and exhausting an inside of the process chamber; and modifying the oxygen-containing layer into an oxynitride layer or a nitride layer by exciting the process gas supplied into the process chamber and supplying an excited process gas to a surface of the substrate.

According to still another embodiment, there is provided a non-transitory computer-readable recording medium storing a program that causes a computer to perform a process, the process including: heating a substrate accommodated in a process chamber, the substrate including a polysilicon film having an oxygen-containing layer thereon; supplying a process gas containing nitrogen and hydrogen into the process chamber; and modifying the oxygen-containing layer into an oxynitride layer or a nitride layer by exciting the process gas supplied into the process chamber and supplying an excited process gas to a surface of the substrate.

According to yet another embodiment, there is provided an apparatus for manufacturing a semiconductor device including: a process chamber accommodating a substrate including a polysilicon film having an oxygen-containing layer formed thereon; a heating unit installed in the process chamber to heat the substrate; a gas supply unit configured to supply a process gas containing nitrogen and hydrogen to the substrate in the process chamber; an excitation unit configured to excite the process gas supplied into the process chamber; an exhaust unit configured to exhaust an inside of the process chamber; and a control unit configured to control at least the heating unit, the gas supply unit, the excitation unit and the exhaust unit so as to modify the oxygen-containing layer into an oxynitride layer or a nitride layer by heating the substrate to a predetermined temperature using the heating unit, exciting the process gas supplied by the gas supply unit using the excitation unit, and supplying the process gas excited by the excitation unit to the substrate.

According to the substrate processing apparatus and the method and program for manufacturing a semiconductor device according to the present invention, the oxidation resistance of a polysilicon film can be improved by modifying an oxygen-containing layer into an oxynitride layer or a nitride layer having a high nitrogen concentration.

What is claimed is:
1. A method of manufacturing a semiconductor device comprising:
   (a) loading a substrate into a process chamber, the substrate including a polysilicon film having an oxygen-containing silicon layer formed thereon;
   (b) heating the substrate to a predetermined temperature equal to or higher than 450° C. and lower than 700° C.;
   (c) supplying a process gas containing nitrogen and hydrogen into the process chamber and generating active species containing nitrogen radicals and hydrogen radicals by exciting the process gas into a plasma state;
   (d) modifying the oxygen-containing silicon layer into a silicon oxynitride layer or a silicon nitride layer by supplying the active species to a surface of the substrate;
   (e) exhausting an inside of the process chamber; and
   (f) unloading a processed substrate from the process chamber.

2. The method according to claim 1, wherein the oxygen-containing silicon layer comprises a native silicon oxide layer.

3. The method according to claim 1, wherein the oxygen-containing silicon layer comprises a silicon oxide layer formed by cleaning the substrate.

4. The method according to claim 1, wherein (d) is performed by controlling a ratio of hydrogen atoms in the active species such that the ratio ranges from 10% to 90%.

5. The method according to claim 1, wherein a thickness of the oxygen-containing silicon layer ranges from 0.5 nm to 2.0 nm.

6. The method according to claim 1, wherein (d) comprises magnetron-discharging the process gas.

7. The method according to claim 1, wherein the process gas comprises a nitrogen-containing gas and a hydrogen-containing gas.

8. The method according to claim 7, wherein a ratio of a flow rate of the nitrogen-containing gas to a flow rate of the hydrogen-containing gas is adjusted in (c).

9. The method according to claim 1, wherein the process gas comprises ammonia gas.

* * * * *